(12) United States Patent
Standing

(10) Patent No.: US 6,573,122 B2
(45) Date of Patent: Jun. 3, 2003

(54) WAFER LEVEL INSULATION UNDERFILL FOR DIE ATTACH

(75) Inventor: Martin Standing, Tonbridge (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/106,927

(22) Filed: Mar. 26, 2002

(65) Prior Publication Data

US 2002/0146861 A1 Oct. 10, 2002

Related U.S. Application Data

(60) Provisional application No. 60/279,102, filed on Mar. 28, 2001.

(51) Int. Cl.[7] .............................................. H01L 21/44
(52) U.S. Cl. ..................... 438/118; 438/108; 438/113; 438/124; 438/127
(58) Field of Search ................ 438/108, 110, 438/113, 117, 118, 124, 125, 126, 127, 119

(56) References Cited

U.S. PATENT DOCUMENTS

| | | | | |
|---|---|---|---|---|
| 5,840,417 A | | 11/1998 | Bolger ........................ 428/323 |
| 5,872,051 A | | 2/1999 | Fallon et al. ................ 438/616 |
| 6,165,885 A | | 12/2000 | Gaynes et al. ............... 438/612 |
| 6,169,022 B1 | | 1/2001 | Saitou ......................... 438/613 |
| 6,228,678 B1 | * | 5/2001 | Gilleo et al. ................. 438/108 |
| 6,228,681 B1 | * | 5/2001 | Gilleo et al. ................. 438/108 |
| 6,238,599 B1 | | 5/2001 | Gelorme et al. ............. 252/514 |
| 6,258,627 B1 | * | 7/2001 | Benenati et al. ............. 438/118 |
| 6,333,206 B1 | * | 12/2001 | Ito et al. ...................... 438/110 |
| 6,333,209 B1 | * | 12/2001 | Coico et al. ................. 438/124 |
| 6,372,547 B2 | | 4/2002 | Nakamura et al. .......... 438/118 |
| 6,387,795 B1 | * | 5/2002 | Shao .......................... 438/110 |
| 6,489,180 B1 | * | 12/2002 | Tsai et al. .................... 438/118 |
| 6,518,093 B1 | * | 2/2003 | Nakamikawa ............... 438/118 |

OTHER PUBLICATIONS

U.S. patent application Publication No. US 2002/0027298A1 published Mar. 7, 2002, entitled Semiconductor Device and Method of Manufacturing the Same—Sakamoto et al.

U.S. patent application Publication No. US 2001/0044197A1 published Nov. 22, 2001 entitled Wafer–Scale Assembly of Chip–Size Packages—Heinen et al.

* cited by examiner

Primary Examiner—Kevin M. Picardat
(74) Attorney, Agent, or Firm—Ostrolenk, Faber, Gerb & Soffen, LLP

(57) ABSTRACT

A process for forming an insulation underfill for soldering semiconductor die solder balls by a solder paste on conductive traces on a support surface. The process comprises the screen printing or deposition from a syringe of thermoplastic or thermosetting epoxy columns between the solder balls, to a height equal to the standoff height of the die from the support surface. The assembly is first heated to a temperature at which the plastic becomes semifluid and before the area over which it will spread becomes contaminated with flux residue; and is next heated to the solder paste reflow temperature.

16 Claims, 6 Drawing Sheets

WAFER LEVEL INSULATION UNDERFILL FOR DIE ATTACH

RELATED APPLICATION

This application claims the benefit of U.S. Provisional Application No. 60/279,102, filed Mar. 28, 2001.

FIELD OF THE INVENTION

This invention relates to the mounting of semiconductor die and more specifically relates to a novel process for the manufacture of semiconductor die with an integral insulation underfill.

BACKGROUND OF THE INVENTION

When semiconductor die such as flip chip die having solder ball connectors on one surface thereof are soldered to a support board, an insulation underfill is commonly provided to fill the volume bounded between the bottom of the die and the top of the board and between the solder balls to improve the device temperature cycling capability. This process usually requires an extra step by the user to deposit the insulation underfill. Commonly, the user will conventionally solder the device solder balls to conductive traces on a printed circuit board and then deposit a low viscosity epoxy material around the perimeter of the die, relying on capillary action to uniformly draw the epoxy while it is still liquid into the interior spaces between the die bottom and printed circuit board top surface.

It is also known to employ wafer level underfills in which the areas around all solder balls are flooded with an epoxy or a thermoplastic material which contains a solder flux. The wafer is then singulated with the plastic underfill in place for each die. During the solder down operation, the underfill material liquefies while reflowing the solder balls, releasing the flux to the solder and flowing around the solder balls. However, this process does not work well and is not in use.

It would be desirable to provide a novel wafer level underfill system for improving the solder down of semiconductor die, or any other product employing solder ball terminals.

BRIEF DESCRIPTION OF THE INVENTION

In accordance with the invention, discrete spaced columns of an underfill plastic are deposited, in the wafer stage and prior to singulation, between solder balls and to a height equal to the final standoff height of the reflowed die. By standoff height is meant the final desired space between the bottom of the die and the top of the support surface receiving the die, such as a printed circuit board surface. The plastic is then engineered to become semifluid at the solder reflow temperature, attaching the die to the board through the plastic columns. Thus, the plastic columns, while not totally attaching the underside of the die to the circuit board, will add significant strength to the overall bond, reducing the direct load on the solder balls.

The underfill plastic of the invention may be a thermoplastic, or, preferably, a thermosetting epoxy. The plastic may be in pellet form. The plastic may be applied to the wafer by any desired screening or dispensing system and contains a solvent which makes the plastic material (which is solid at room temperature) fluid and compatible with dispensing or printing. Once deposited, the solvent will be driven off, leaving a solid epoxy, this occurring before the wafer or die are supplied to an end user. The die will be mounted by a user who mounts the device into a conventional solder paste used for connecting solder balls.

During solder reflow the plastic becomes at least semifluid at about 80° C., forming the connection between the die and the PCB. The reason for this early phase change is that flux in conventional solder paste starts to become mobile at temperatures in excess of about 80° C. and the epoxy should make its connection between die and PCB before the area becomes contaminated with flux residue. The epoxy will then begin its cure by raising the temperature to 150° C. or more.

Several methods for depositing thermosetting epoxies can be employed.

In a first method, a screen with clearance cut outs which align with and fit over the solder balls align central openings with the areas to receive insulation pillars. A thermosetting material which is solid at room temperature is thinned with solvents and is printed onto the wafer substrate in a screen printing type process so that plastic columns are printed between solder balls. The solvent is then driven off in a low temperature bake in the oven, leaving solid pillars of thermosetting plastic between the solder balls.

In a second method, the thermosetting plastic can be thinned with a solvent so it can be conveniently dispensed from a syringe, depositing self supporting columns of plastic between solder balls. The solvent is then driven off in a low temperature step, leaving solid plastic columns.

In a third method, very shallow columns of thinned thermosetting plastic are first deposited between solder balls, and, very small diameter pellets of the solid plastic (small in relation to the diameter of a column) are then scattered, or dusted over the wafer surface, adhering mainly to the area coated with the solvent rich shallow dots of plastic. The pellets outside of these areas are removed, as by inversion of the wafer or by air flow over the surface, and the solvents are then driven off in a low temperature bake to complete the process.

DETAILED DESCRIPTION OF THE DRAWINGS

Figure 1:
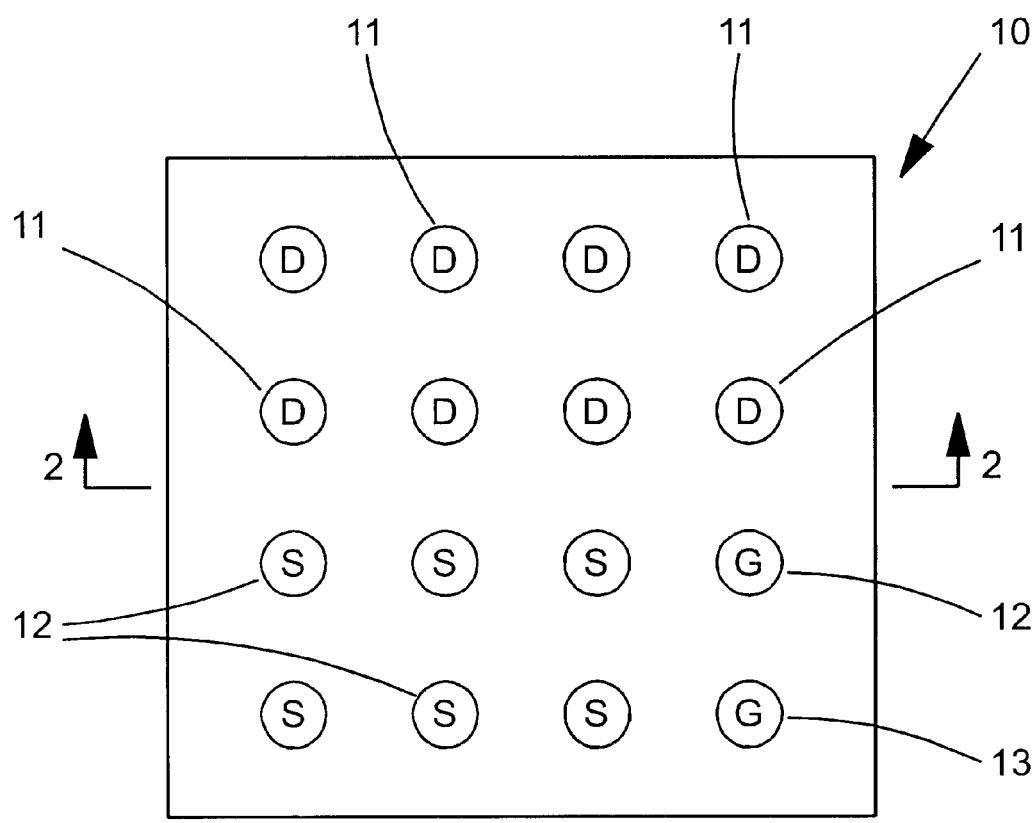
FIG. 1 is a plan view of a known flip chip MOSFET having drain, source and gate contact balls on one surface of the die.
Figure 2:
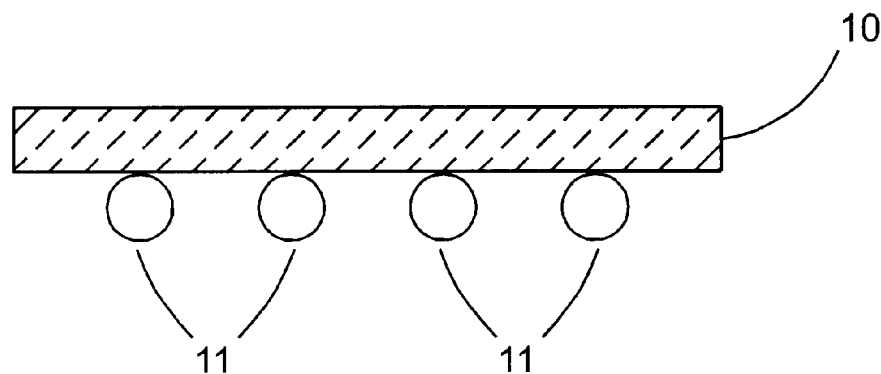
FIG. 2 is a cross-section of FIG. 1 taken across section line 2—2 in FIG. 1.
Figure 3:
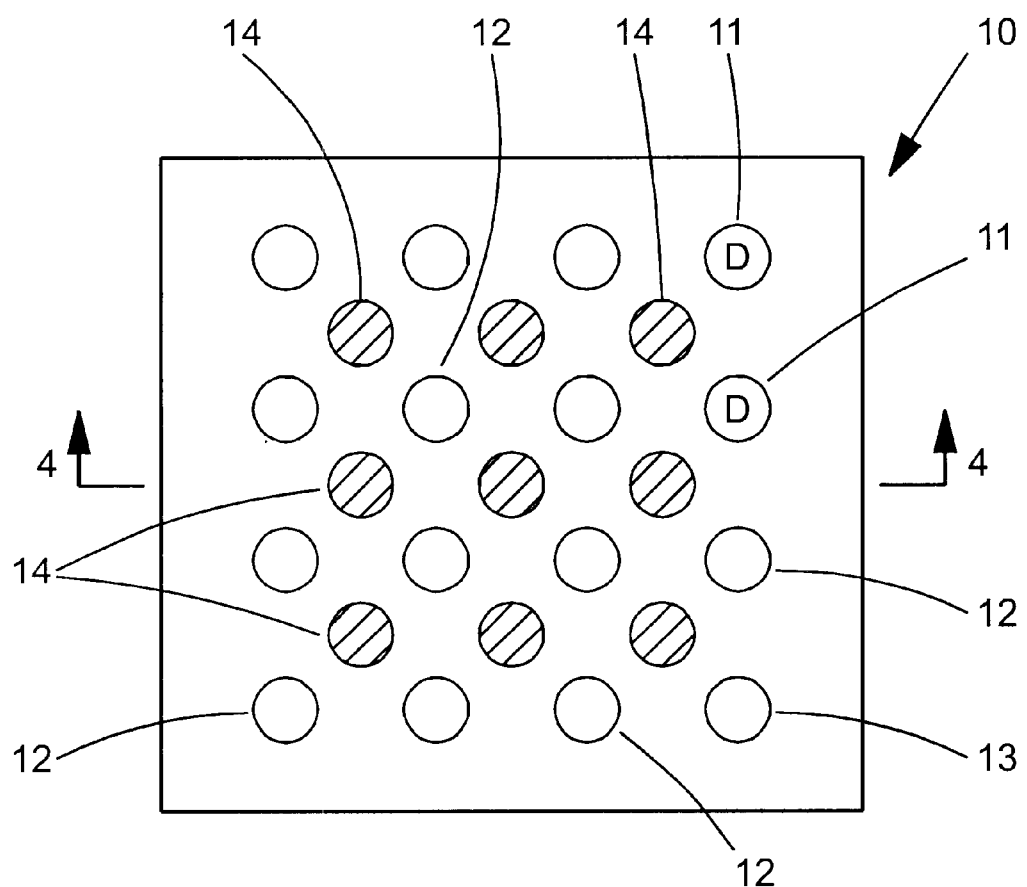
FIG. 3 is a view like FIG. 1 after the deposition of plastic columns to a selected set-off height.
Figure 4:
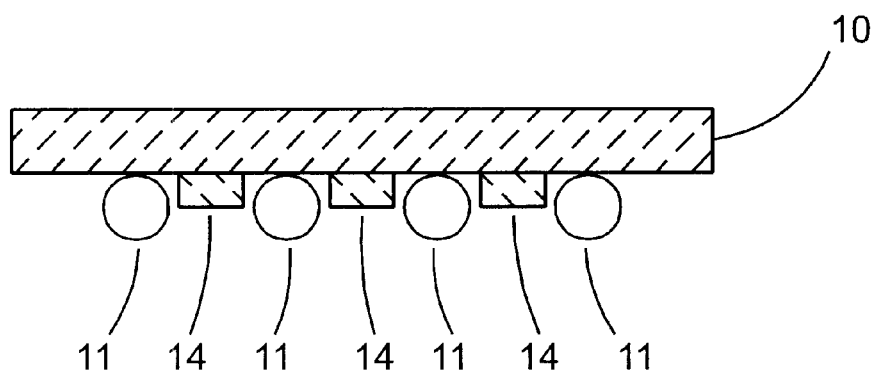
FIG. 4 is a cross-section of FIG. 3 taken across section line 4—4 in FIG. 3.

Referring first to FIGS. 1 and 2, a silicon die 10, which is singulated from a wafer of identical die has a plurality of solder ball connectors, such as drain solder balls 11, source solder balls 12 and a gate solder ball 13. These balls are connected to appropriate regions on the die in the known manner. In accordance with the invention, a plurality of plastic columns 14 (FIGS. 3 and 4) are deposited on the bottom surface of the die (while the die are still in wafer form) as by screening or deposition, to a height equal to the final stand-off height "X" in FIG. 5 between the bottom surface of die 10 and the top surface 20 of a support 21. Support 21, which may be a printed circuit board, has conductive traces (not shown) on surface 20 adapted to receive contact balls 11, 12 and 13.

Plastic columns 14 may be of any desired plastic such as a thermoplastic, engineered to become semifluid at the solder reflow temperature for soldering die 10 to PCB 21. Thermosetting plastics will take the form of an epoxy resin system. Other bases for the epoxy system may be employed, for example, silicones and polyimides. Solder temperatures to be used will cover conventional eutectic or near eutectic lead based solders (Sn63, Pb37) having a melting temperature of 183° C. and lead-free solders having melting points of about 220° C.

Figure 5:
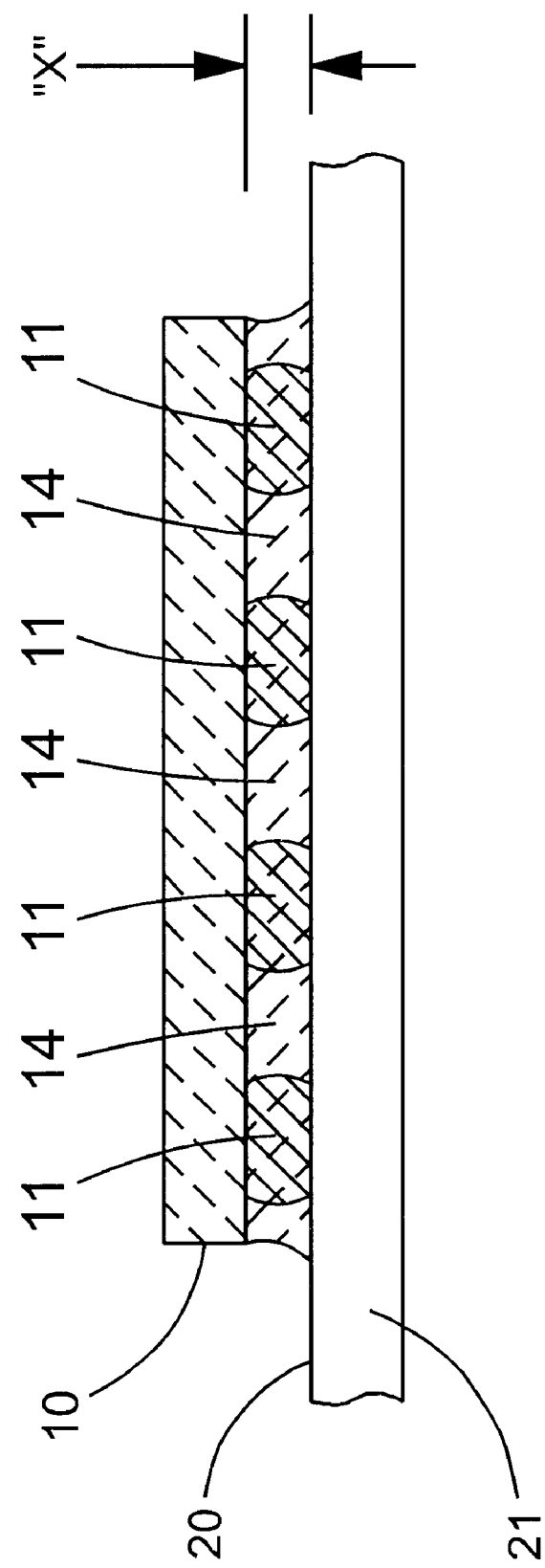
FIG. 5 is a cross section of the die of FIGS. 3 and 4 after its mounting and solder-down to a printed circuit board.

Thus, as shown in FIG. 5, to solder die 10 to conductive traces on printed circuit board (PCB) 21, the temperature is raised to a temperature which causes the solder balls 11, 12, 13 to reflow, and the columns 14 to go semifluid to adhere the die 10 to PCB 21.

Columns 14 may also be a thermosetting epoxy which contains a solvent which will have been evaporated by a low temperature bake after the material is placed on a wafer. When reflowing the part, plastic 14 should become fluid at about 80° C. to form the connection between die 10 and PCB 21 and at a temperature which is lower than the temperature at which the solder paste flux starts to become mobile. Cure initiation of the plastic is at about 150° C. or greater. The solvent will have been evaporated soon after deposition of the plastic and will not be present when the end user mounts the part on a PCB or other support.

Figure 6:
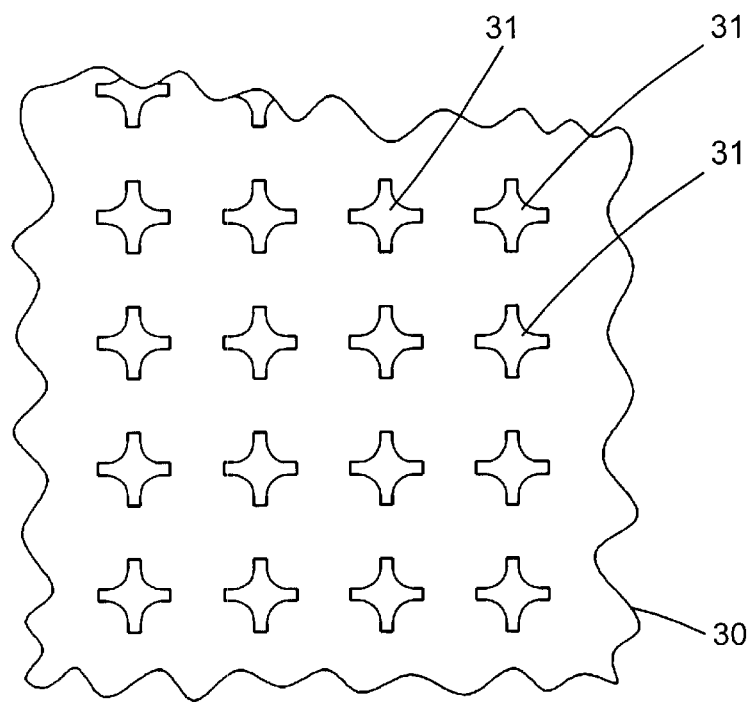
FIG. 6 is a top view of a printing screen which may be used to print a thermosetting epoxy onto the solder ball side of the wafer of FIGS. 1 to 5.

FIG. 6 shows a screen 30 which may be used to deposit "X" shaped columns of plastic onto a wafer 10 where each column divides 4 adjacent balls. Thus, the screen 30 has X-shaped apertures 31, arrayed in rows and columns such that the apertures nest between the solder balls 11, 12, 13 one wafer 10 of FIGS. 1 to 5. In the embodiment shown, and, as will be later described each of the die to be singulated from wafer 10 may have only 4 solder balls (two drain balls, on source ball and one gate ball) as for a flip chip type MOSFET.

Figure 7:
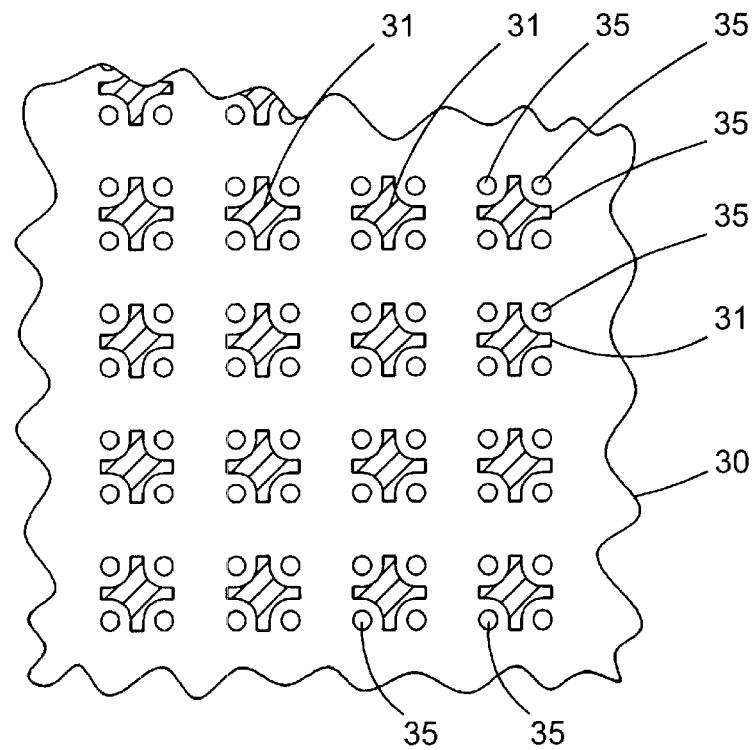
FIG. 7 shows the screen of FIG. 6 with its X-shaped openings aligned with respective groups of solder balls on the wafer.

FIG. 7 shows the screen 30 from the bottom showing the apertures 31 after a partial etch giving suitable clearance for the solder-balls 35.

Figure 8:
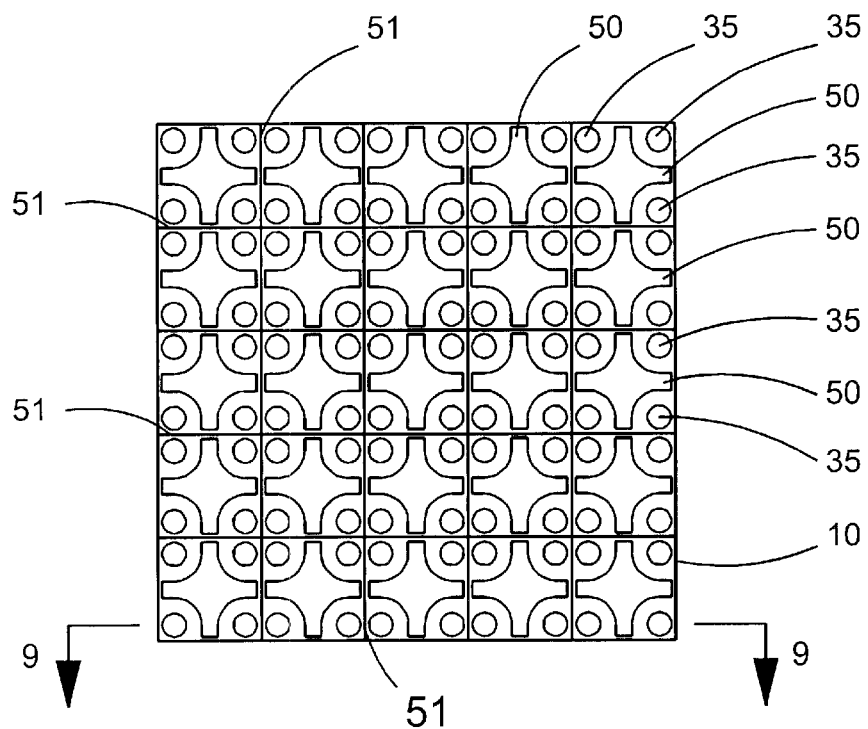
FIG. 8 shows the wafer of FIG. 7 after X-shaped epoxy pillars have been formed on the wafer.

FIG. 8 shows the wafer 10 after a plurality of X-shaped columns of epoxy 50 have been printed on the wafer, each column serving a cluster of 4 solder balls 35. FIG. 8 also shows the lines 51 along which the wafer 10 is singulated to form die having 4 solder balls and an X-shaped epoxy underfill pattern.

Figure 9:
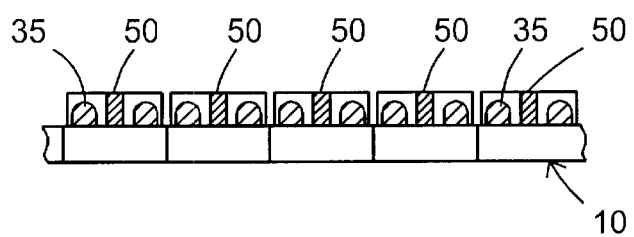
FIG. 9 is a side view of FIG. 8 showing the epoxy pillars before the solvent is driven off.
Figure 10:
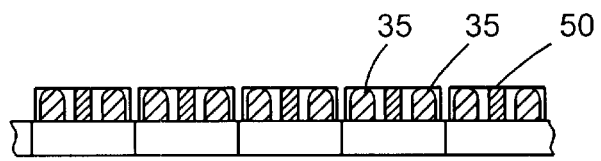
FIG. 10 is a side view of FIG. 8 and shows the epoxy pillars after the solvent is driven off.

FIG. 9 is a cross-section of FIG. 8 showing the epoxy columns 50 after their screening onto wafer 10 and prior to driving off the solvent in the plastic. It will be noted that the height of columns 50 is greater than that of the contact balls 35. This excess height is carefully controlled so that, after driving off the solvent, the height of columns 50 is equal to that of the contacts 35. This is done by balancing the quantities of epoxy and solvent to give the desired shrinkage.

Figure 11:
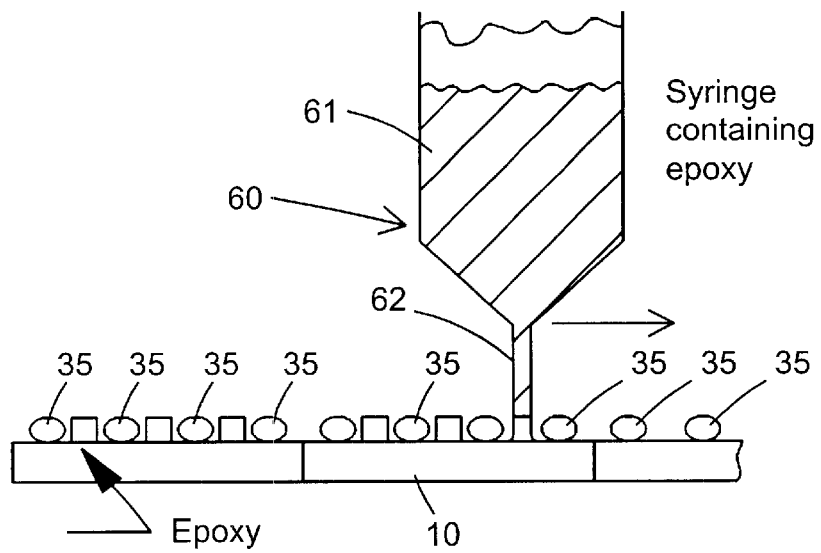
FIG. 11 shows the deposition of epoxy pillars between solder balls, from a syringe.

FIG. 11 shows another method for depositing the thermosetting plastic columns on wafer 10 in which a syringe 60 is loaded with a solvent rich thermosetting plastic in chamber 61 with a plunger (not shown) adapted to dispense plastic columns 62 (of any desired cross-section) between the contact balls 35. The syringe may be scanned or stepped across the wafer 10, depositing columns through the syringe needle 62. Alternatively, the wafer 10 may be moved relative to a stationary dispensing syringe.

In a further embodiment of the invention, the plastic may take the form of pellets of the epoxy material. These pellets may have the shape of small spheres or other geometric shapes of solid epoxy. The same basic epoxy material can then be treated with a solvent to make it fluid and this can be dispensed in very small quantities in the areas in which the epoxy columns are required. If the pellets of epoxy are then spread across the wafer area they will stick only where the small areas of liquid epoxy have been deposited. If the solvent is then dried in the same way as described previously then a similar product as using the other methods described will result. Effectively, this pellet process uses the same basic material to form the pellet and an adhesive pad although both may have modifications made to enhance their respective properties.

Figure 12:
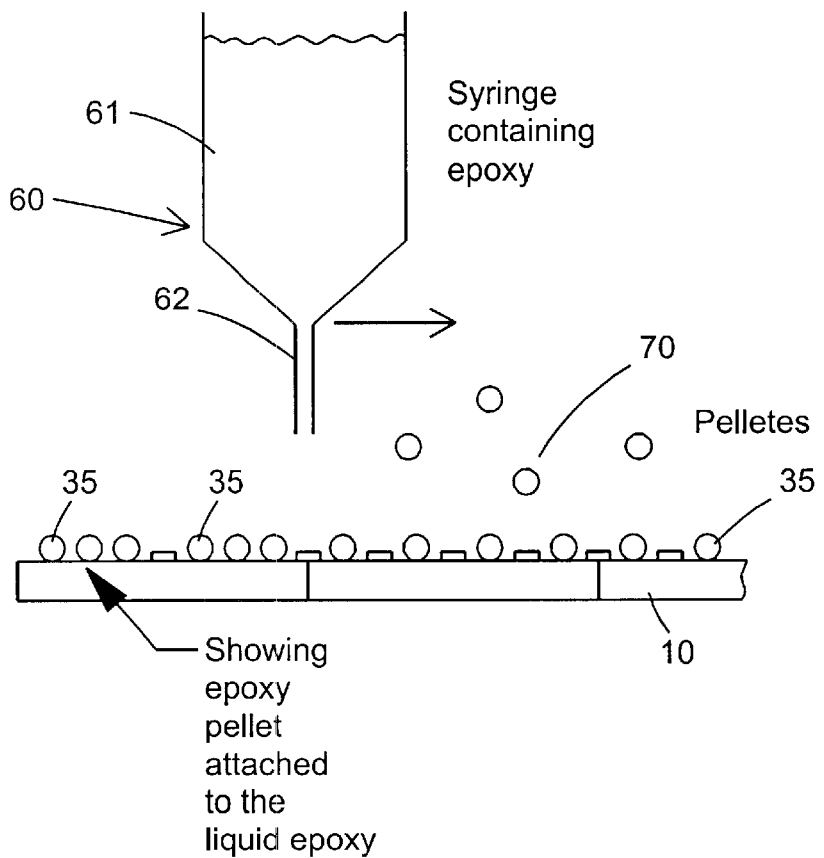
FIG. 12 shows a further process for depositing the epoxy pillars or columns in which small solid pellets of plastic are dusted over a wafer to adhere to small areas of previously applied liquid epoxy.

This process is shown in FIG. 12 in which the syringe 60 of FIG. 11 is employed, containing a plastic and solvent which makes it easily dispensable. Very small quantities of the solvent rich material are first deposited on the wafer 10, between contact balls. This small volume of material then acts as a contact adhesive to small pellets of the same plastic in solid form. A different plastic material pellet can also be used. The solid pellets are preferably of the same base thermosetting plastic but are not reduced with solvents.

Once the small liquid spots are dispensed, small solid pellets 70 can be scattered across the wafer and will attach to the areas where the thinned material has been deposited.

Once the pellets 70 attach to the adhesive areas, the excess pellets can be cleared by inverting the wafer, or the like.

In a final step, the solvent is driven from the small deposited areas, in a low temperature bake.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. The process of preparing a semiconductor wafer containing semiconductor die with solder ball contacts on one surface to have an inherent underfill that is activated during solderdown of the die; said process comprising the steps of: forming on die in wafer form a plurality of spaced self-supporting plastic columns between the solder balls to a height about equal to the desired stand-off height of a die from its support surface; and thereafter singulating said die from said wafers; said plastic columns having the property becoming semifluid at a first temperature which is lower than the temperature at which solder flux is released from a solder paste during solder down, and thereafter becoming fluid to fill the volume between solder balls at a second temperature at which the solder paste reflows.

2. The process of claim 1, wherein said plastic is a thermoplastic.

3. The process of claim 1, wherein said plastic is a thermosetting epoxy, wherein the solvent of said epoxy evaporates at said second temperature.

4. The process of claim 1, wherein said plastic columns are formed by screen printing.

5. The process of claim 1, wherein said plastic columns are formed by deposition.

6. The process of claim 1, wherein said first temperature is about 80° C.

7. The process of claim 1, wherein said second temperature is in excess of about 150° C.

8. The process of claim 2, wherein said first temperature is about 80° C.

9. The process of claim 3, wherein said second temperature is in excess of about 150° C.

10. The process of soldering a flip chip semiconductor die to a support surface; said die having spaced solder ball contacts on one surface, said process comprising the steps of:

forming a plurality of spaced self supporting plastic columns between the solder balls to a height about equal to the desired stand-off height of a die from its support surface;

applying a solder paste to said support surface and said solder balls;

placing said die onto said support surface with said solder balls in contact with said support surface and with said solder paste;

raising the temperature of said plastic columns to a first temperature at which said columns become semifluid, but before said solder paste releases solder flux;

and thereafter raising the temperature to a second temperature at which solder flux is released and the solder balls are soldered to said support surface and at which said plastic becomes fluid to fill the volume between solder balls.

11. The process of claim 10, wherein said plastic is a thermoplastic.

12. The process of claim 10, wherein said plastic is a thermosetting epoxy, wherein the solvent of said epoxy evaporates at said second temperature.

13. The process of claim 10, wherein said plastic columns are formed by screen printing.

14. The process of claim 10, wherein said plastic columns are formed by deposition.

15. The process of claim 10, wherein said first temperature is about 80° C.

16. The process of claim 10, wherein said second temperature is in excess of about 150° C.

* * * * *